(12) United States Patent
Kudo et al.

(10) Patent No.: US 10,453,982 B2
(45) Date of Patent: Oct. 22, 2019

(54) SOLAR BATTERY MODULE

(71) Applicants: TOYOTA JIDOSHA KABUSHIKI KAISHA, Toyota-shi (JP); KABUSHIKI KAISHA TOYOTA JIDOSHOKKI, Kariya-shi (JP)

(72) Inventors: Yuki Kudo, Susono (JP); Shoichi Iwamoto, Izunokuni (JP); Hiroyuki Ohba, Suntou-gun (JP); Hirotaka Inaba, Kariya (JP)

(73) Assignees: TOYOTA JIDOSHA KABUSHIKI KAISHA, Toyota-shi (JP); KABUSHIKI KAISHA TOYOTA JIDOSHOKKI, Kariya-shi (JP)

( * ) Notice: Subject to any disclaimer, the term of this patent is extended or adjusted under 35 U.S.C. 154(b) by 0 days.

(21) Appl. No.: 15/350,830

(22) Filed: Nov. 14, 2016

(65) Prior Publication Data
US 2017/0186898 A1    Jun. 29, 2017

(30) Foreign Application Priority Data

Dec. 24, 2015  (JP) .................................. 2015-252163

(51) Int. Cl.
*H01L 31/05* (2014.01)
*H01L 31/049* (2014.01)
(Continued)

(52) U.S. Cl.
CPC ........ *H01L 31/0508* (2013.01); *H01L 31/042* (2013.01); *H01L 31/048* (2013.01);
(Continued)

(58) Field of Classification Search
CPC . H01L 31/05; H01L 31/0504; H01L 31/0508; H01L 31/0512; H01L 31/0516;
(Continued)

(56) References Cited

U.S. PATENT DOCUMENTS 5,559,390 A * 9/1996 Makishima ........... H01J 1/3042
313/308
6,315,575 B1 * 11/2001 Kajimoto .............. H01L 31/188
136/256
(Continued)

FOREIGN PATENT DOCUMENTS

DE      198 48 682 A1    5/2000
DE  10 2004 044 061 A1    4/2006
(Continued)

OTHER PUBLICATIONS

German Office Action dated Nov. 5, 2018 for German Application No. 102016224575.9 (with English Translation).

*Primary Examiner* — Eli S Mekhlin
(74) *Attorney, Agent, or Firm* — Oblon, McClelland, Maier & Neustadt, L.L.P.

(57) ABSTRACT

A solar battery module is provided that includes plural solar battery cells, plural interconnectors each having a shock absorber, a sealing layer, a back face layer, and a front face layer having optical transparency. The plural solar battery cells each include an electrode on a peripheral edge portion at a back face that does not receive sunlight. The plural interconnectors extend along the peripheral edge portions, and connect the electrodes of the plural solar battery cells to each other. The sealing layer seals each of the solar battery cells and each of the interconnectors. The shock absorber is disposed in a region between corner portions of adjacent or diagonally opposing solar battery cells, and permits movement of the solar battery cells accompanying expansion or contraction of at least one out of the back face layer or the front face layer.

5 Claims, 14 Drawing Sheets

(51) Int. Cl.
*H01L 31/048* (2014.01)
*H02S 40/00* (2014.01)
*H01L 31/042* (2014.01)

(52) U.S. Cl.
CPC ........ *H01L 31/049* (2014.12); *H01L 31/0481* (2013.01); *H02S 40/00* (2013.01); *Y02B 10/10* (2013.01); *Y02E 10/50* (2013.01)

(58) Field of Classification Search
CPC ............... H01L 31/048; H01L 31/0481; H01L 31/0488; H01L 31/049
See application file for complete search history.

(56) References Cited

U.S. PATENT DOCUMENTS

| | | | |
|---|---|---|---|
| 7,390,961 B2 * | 6/2008 | Aschenbrenner | ... H01L 31/0516 136/244 |
| 2003/0075210 A1 | 4/2003 | Stollwerck et al. | |
| 2005/0268959 A1 | 12/2005 | Aschenbrenner et al. | |
| 2008/0000523 A1 | 1/2008 | Hilgarth et al. | |
| 2009/0178708 A1 * | 7/2009 | Higashiyama | ........ H01L 31/048 136/256 |
| 2011/0277817 A1 * | 11/2011 | Ide | .................. H01L 31/022441 136/246 |
| 2014/0124013 A1 | 5/2014 | Morad et al. | |
| 2014/0124014 A1 | 5/2014 | Morad et al. | |
| 2014/0295613 A1 * | 10/2014 | O'Sullivan | ........... H01L 31/028 438/87 |
| 2014/0373903 A1 * | 12/2014 | Hashimoto | ......... H01L 31/0508 136/251 |
| 2015/0249177 A1 | 9/2015 | Ishii et al. | |

FOREIGN PATENT DOCUMENTS

| | | |
|---|---|---|
| DE | 11 2013 005 744 T5 | 9/2015 |
| EP | 1 302 988 A2 | 4/2003 |
| EP | 2 958 152 A1 | 6/2015 |
| JP | 06-302266 A | 10/1994 |
| JP | 2001-352089 | 12/2001 |
| JP | 2005-11869 | 1/2005 |
| JP | 2005-72115 | 3/2005 |
| JP | 2009-088072 A | 4/2009 |
| JP | 2011-71214 | 4/2011 |
| JP | 5164202 | 3/2013 |
| JP | 2014-110254 A | 6/2014 |
| JP | 2015-534288 A | 11/2015 |
| WO | 2012/081382 A1 | 6/2012 |
| WO | 2013/042683 A1 | 3/2013 |

* cited by examiner

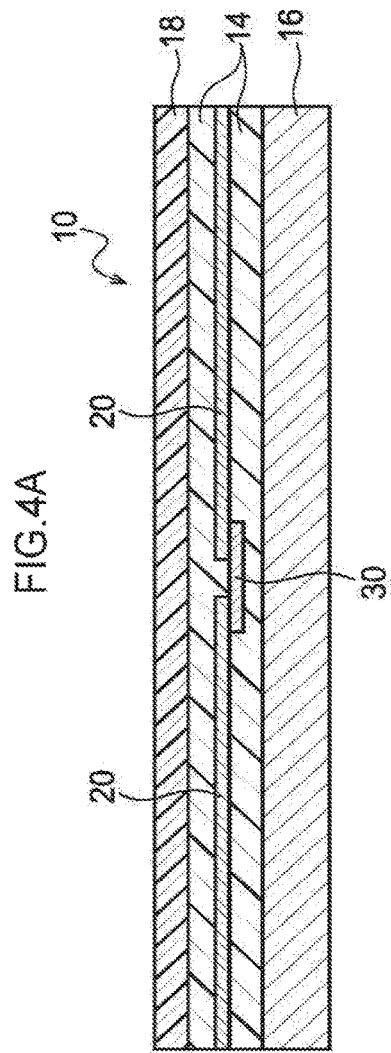
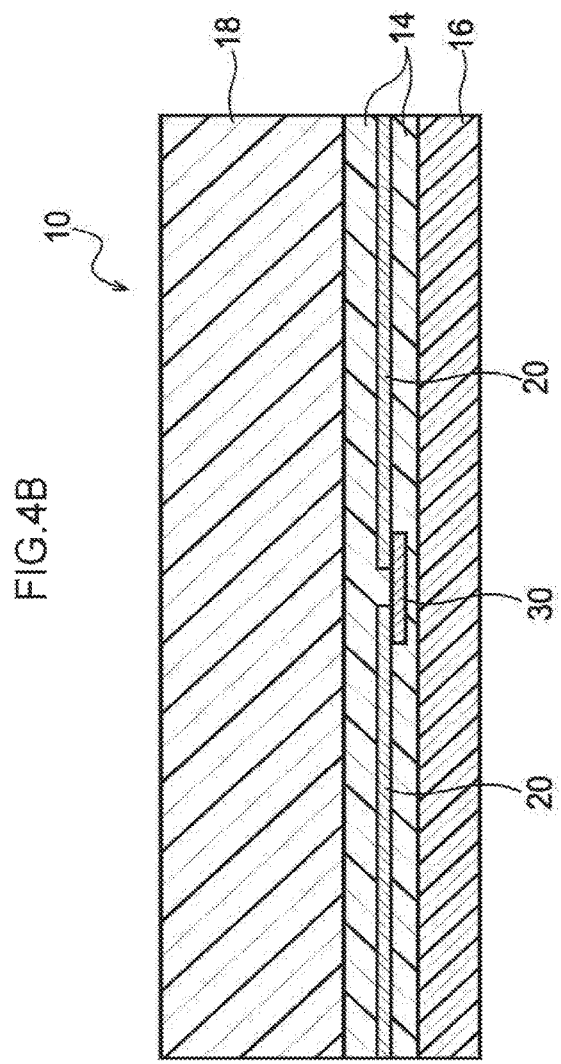

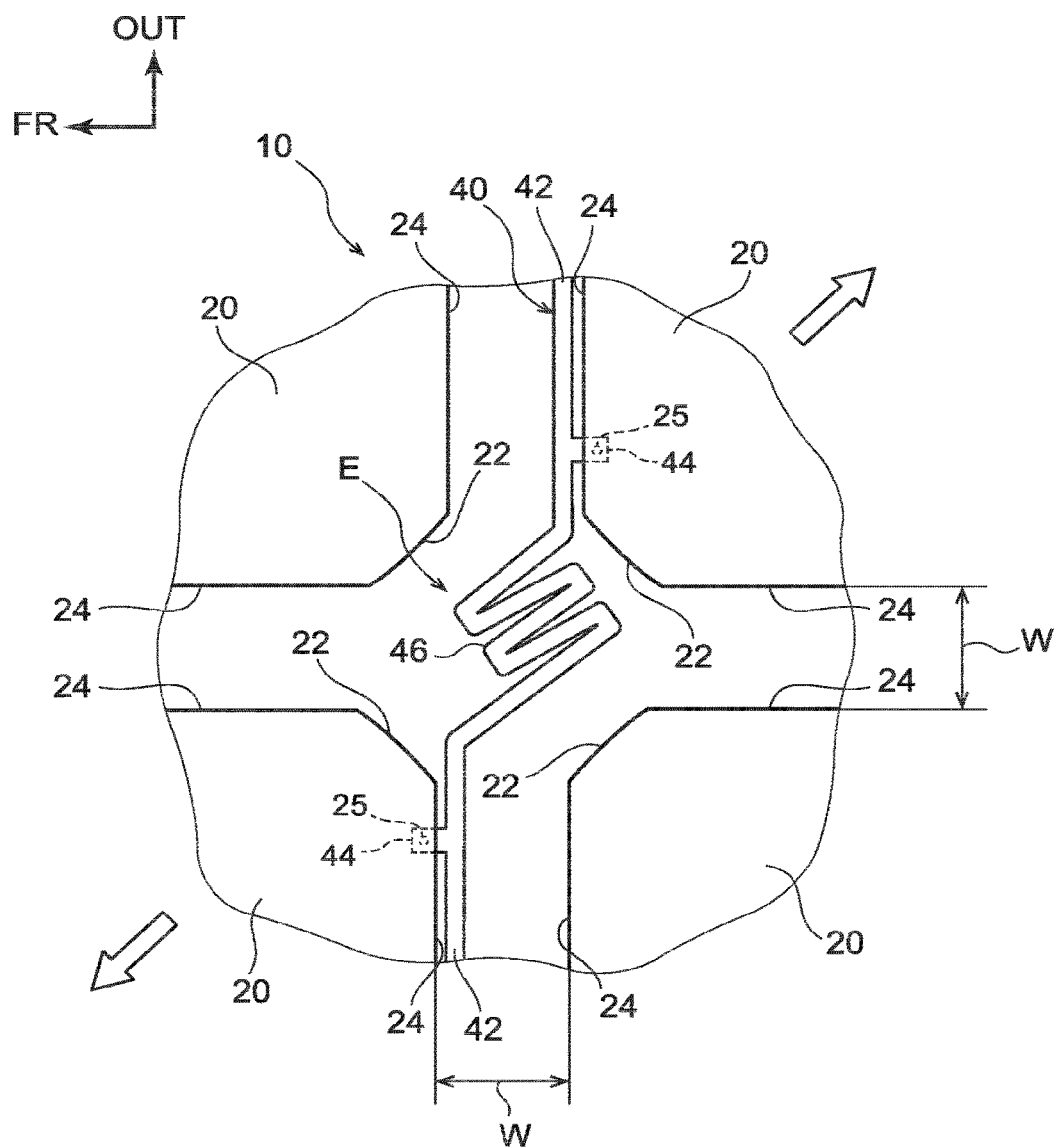

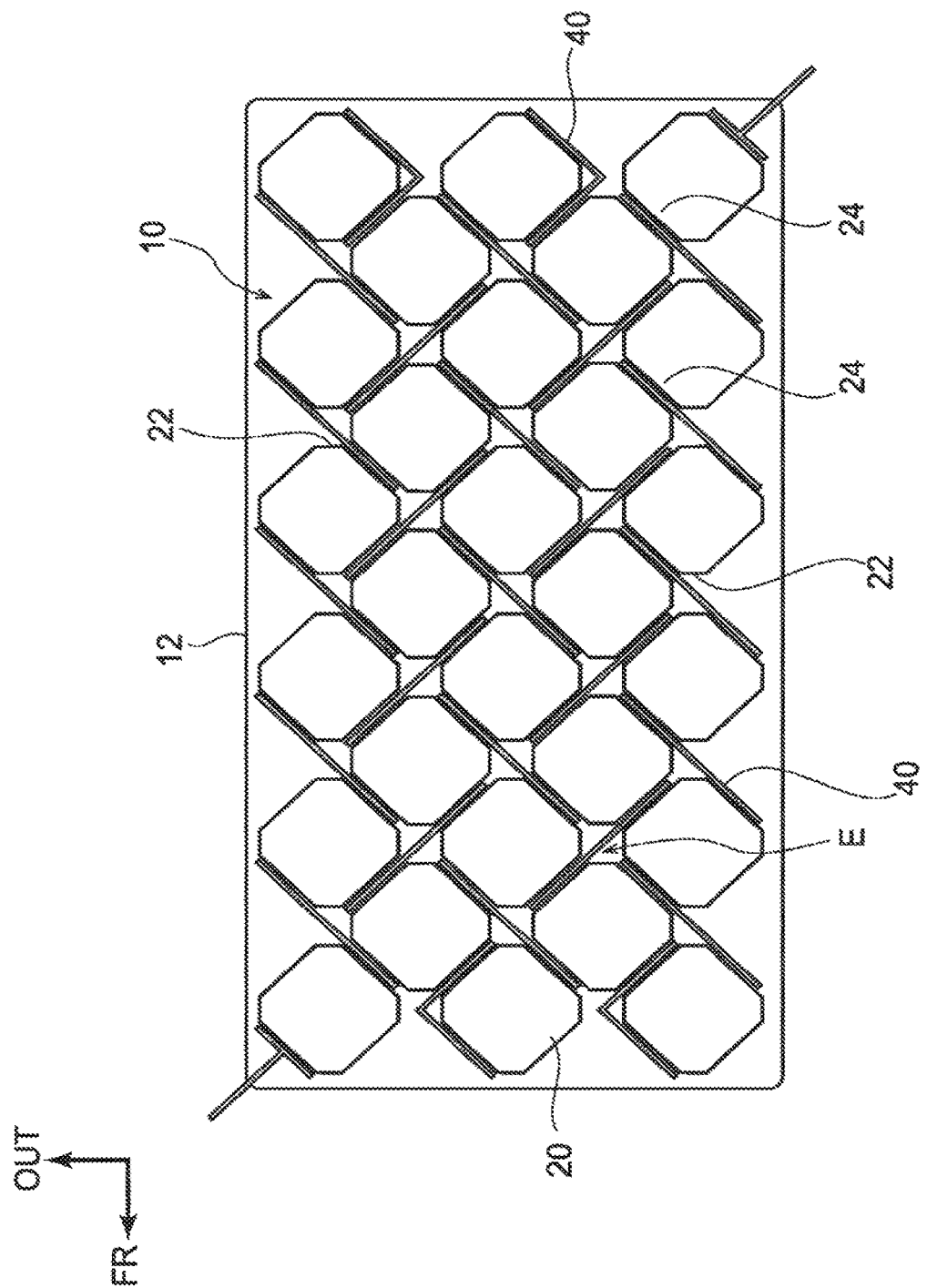

SOLAR BATTERY MODULE

CROSS-REFERENCE TO RELATED APPLICATION

This application claims priority under 35 USC 119 from Japanese Patent application No. 2015-252163 filed on Dec. 24, 2015, the disclosure of which is incorporated by reference herein.

BACKGROUND

Technical Field

The present disclosure relates to a solar battery module.

Related Art

A structure is hitherto known in which a bent portion is provided at interconnectors connecting respective solar battery cells of a solar battery module that includes plural back-contact solar battery cells having an electrode on a back face such that the interconnectors are not easily broken when the solar battery module expands or contracts (for example, see Japanese Patent Application Laid-Open (JP-A) No. 2005-11869).

However, in back-contact solar battery cells, there is still room for improvement with regards to structures that not only suppress breaks in the interconnectors, but also suppress connection breaks at locations where solar battery cells are connected to the interconnectors while suppressing a decrease in the cell-to-total-surface-area ratio of the solar battery cells.

SUMMARY

The present disclosure obtains a solar battery module capable of suppressing breaks in interconnectors, and capable of suppressing connection breaks at locations where solar battery cells are connected to the interconnectors, while suppressing a decrease in the cell-to-total-surface-area ratio of the solar battery cells.

A first aspect of the present disclosure is a solar battery module including plural solar battery cells, plural interconnectors, a sealing layer, a back face layer, and a front face layer. The plural solar battery cells are each formed substantially rectangular-shaped, and each include an electrode on a peripheral edge portion at a back face side does not receive sunlight. The plural interconnectors extend along the peripheral edge portions of the plurality of solar battery cells, and connect the electrodes of the plural solar battery cells to each other, each of the interconnectors including a shock absorber. The sealing layer seals the plural solar battery cells and the plural interconnectors. The back face layer is formed from a metal material or a resin material having a greater linear expansion coefficient than the linear expansion coefficient of the plural solar battery cells, and is adhered to a back face side of the sealing layer which does not receive sunlight. The front face layer is formed from a resin material having optical transparency and a greater linear expansion coefficient than the linear expansion coefficient of the solar battery cells, and is adhered to a front face of the sealing layer on the opposite side to the back face of the sealing layer. Each shock absorber is disposed in a region between corner portions of solar battery cells that are adjacent or diagonally opposed to each other among the plural solar battery cells, and permits movement of the solar battery cells accompanying expansion or contraction of at least one out of the back face layer or the front face layer.

According to the first aspect, the shock absorber is provided at the interconnectors to permit movement of the solar battery cells accompanying expansion or contraction of at least one out of the back face layer or the front face layer. Accordingly, breaks in the interconnectors are suppressed, and connection breaks at locations where the solar battery cells are connected to the interconnectors are suppressed, compared to configurations in which the interconnectors are not provided with a shock absorber. Moreover, since the shock absorber is disposed in the region between corner portions of solar battery cells that are adjacent or diagonally opposed to each other from out of the plural solar battery cells, dead space of the solar battery module is effectively utilized, and a decrease in the cell-to-total-surface-area ratio of the solar battery cells is suppressed.

According to the first aspect, it is possible to suppress breaks in interconnectors, and it is possible to suppress connection breaks at locations where the solar battery cells are connected to the interconnectors, while suppressing a decrease in the cell-to-total-surface-area ratio of the solar battery cells.

A second aspect of the present disclosure is the solar battery module of the first aspect, wherein each shock absorber is formed in a meandering shape in plan view.

According to the second aspect, the shock absorber is formed in a meandering shape in plan view. Accordingly, breaks in the interconnectors are more effectively suppressed, and connection breaks at locations where the solar battery cells are connected to the interconnectors are more effectively suppressed, compared to configurations in which the shock absorber is not formed in a meandering shape in plan view.

According to the second aspect, it is possible to more efficiently suppress breaks in interconnectors, and it is possible to more efficiently suppress connection breaks at locations where the solar battery cells are connected to the interconnectors.

A third aspect of the present disclosure is the solar battery module of the first aspect or the second aspect, wherein the interconnectors connect together of the plural solar battery cells that are disposed diagonally to each other across the region.

According to the third aspect, the interconnectors connect together electrodes of the plural solar battery cells that are disposed diagonally to each other across the above region. Accordingly, the dimensions of the shock absorber can be made larger than in configurations in which the interconnectors do not connect together electrodes of plural solar battery cells that are disposed diagonally to each other across the above region.

According to the third aspect, the dimensions of the shock absorber can be made larger.

A fourth aspect of the present disclosure is the solar battery module of the first aspect, wherein the interconnectors are formed in a circuit shape in plan view, with the shock absorber disposed in a region, among the plural regions, at each extension direction end of the interconnectors.

According to the fourth aspect, the interconnectors are formed in a circuit shape in plan view, and the shock absorber is disposed in each of the above regions at each extension direction side of the interconnectors. Accordingly, breaks in the interconnectors are more effectively suppressed, and connection breaks at locations where the solar battery cells are connected to the interconnectors are more effectively suppressed, compared to configurations in which the interconnectors are not formed in a circuit shape in plan view, and the shock absorber is not disposed in each of the above regions at each extension direction side of the interconnectors.

According to the fourth aspect, it is possible to more efficiently suppress breaks in interconnectors, and it is possible to more efficiently suppress connection breaks at locations where the solar battery cells are connected to the interconnectors.

BRIEF DESCRIPTION OF THE DRAWINGS

Exemplary embodiment of the present disclosure will be described in detail based on the following figures, wherein:

FIG. 4A is a diagram schematically illustrating a cross-section of a solar battery module according to the first exemplary embodiment in which a back face layer is a metal layer;

FIG. 4B is a diagram schematically illustrating a cross-section of a solar battery module according to the first exemplary embodiment in which a back face layer is a resin layer;

FIG. 10 is a partial enlarged plan view illustrating a state after a solar battery module according to the second exemplary embodiment has expanded;

FIG. 12 is a plan view illustrating a modified example of a solar battery module according to the second exemplary embodiment.

DETAILED DESCRIPTION

Detailed explanation follows regarding exemplary embodiments of the present disclosure, with reference to the drawings. For convenience of explanation, examples are given in which a solar battery module 10 according to the exemplary embodiments is provided at a roof 12 of a vehicle. The arrow UP indicates the vehicle body upward direction, the arrow FR indicates the vehicle body frontward direction, and the arrow OUT indicates the vehicle width direction outside as appropriate in each of the drawings.

In the following explanation, reference to the up-down, front-rear, and left-right directions refers to up-down in the vehicle body vertical direction, frontward-rearward in the vehicle body front-rear direction, and left-right in the vehicle body left-right direction (vehicle width direction), unless otherwise specified. Although the roof 12 of the vehicle curves so as to bulge toward the vehicle body upper side in side view, the roof 12 is illustrated as a flat surface in each of the drawings. An upper face that receives sunlight will be referred to as the front face of the solar battery module 10, and a lower face at an opposite side thereto that does not receive sunlight will be referred to as the back face of the solar battery module 10.

First Exemplary Embodiment

Figure 1:
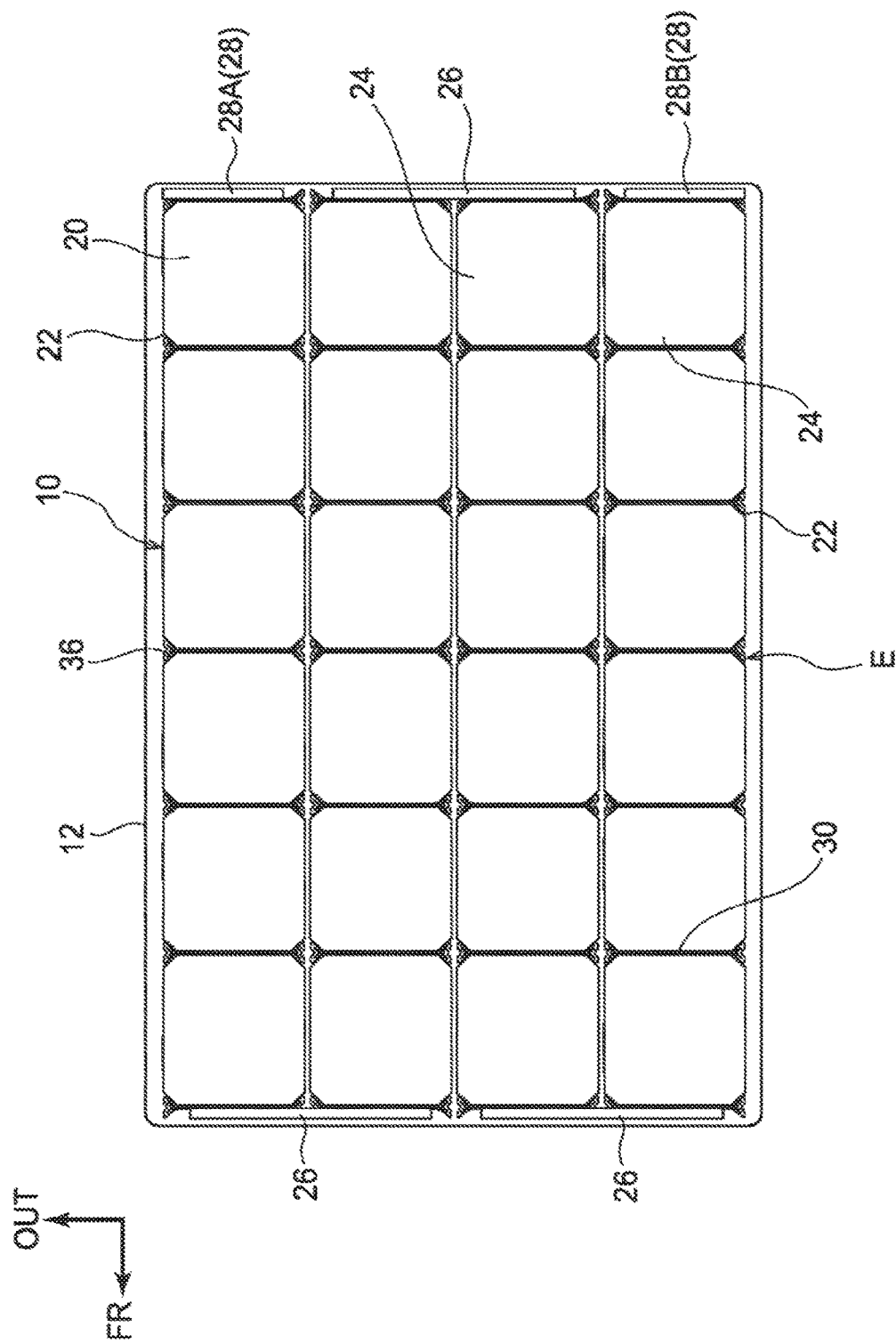
FIG. 1 is a plan view illustrating a solar battery module according to a first exemplary embodiment.

First, explanation follows regarding the solar battery module 10 according to a first exemplary embodiment. As illustrated in FIG. 1, the solar battery module 10 provided at the roof 12 of a vehicle includes plural solar battery cells 20 two-dimensionally arrayed in plan view (for example, arrayed with four rows in the vehicle width direction and six rows in the vehicle body front-rear direction).

Each of the solar battery cells 20 may employ a conventionally known solar battery cell with excellent power generation output. Specific examples of the solar battery cell 20 include silicon (such as single crystal silicon, polycrystalline silicon, microcrystalline silicon, and amorphous silicon), compound semiconductor (such as InGaAs, GaAs, CIGS, and CZTS), dye sensitized, and organic thin film types of solar battery cell. Of these, a silicon solar battery cell 20 is preferable, and a single crystal silicon or polycrystalline silicon solar battery cell 20 is particularly preferable.

Each of the solar battery cells 20 is formed in an octagonal shape having corner portions 22 obtained by diagonally cutting away the four corners of a square shape. Moreover, the solar battery cells 20 are arrayed such that respective peripheral edge portions 24 are in close proximity and oppose each other, and, on the back face of each of the solar battery cells 20, electrodes 25 are provided at each peripheral edge portion 24 that runs along the vehicle width direction.

Figure 2:
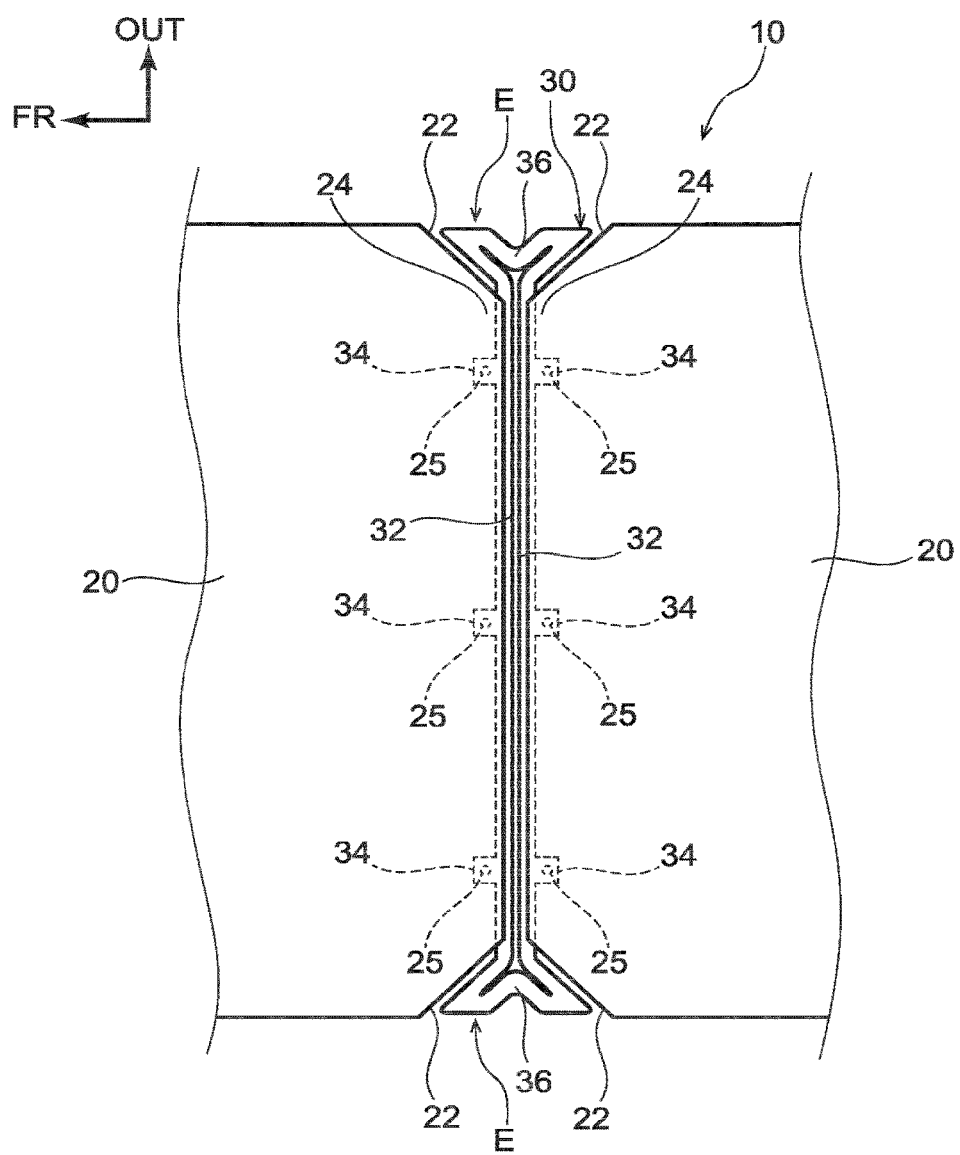
FIG. 2 is a partial enlarged plan view illustrating a solar battery module according to the first exemplary embodiment.
Figure 3:
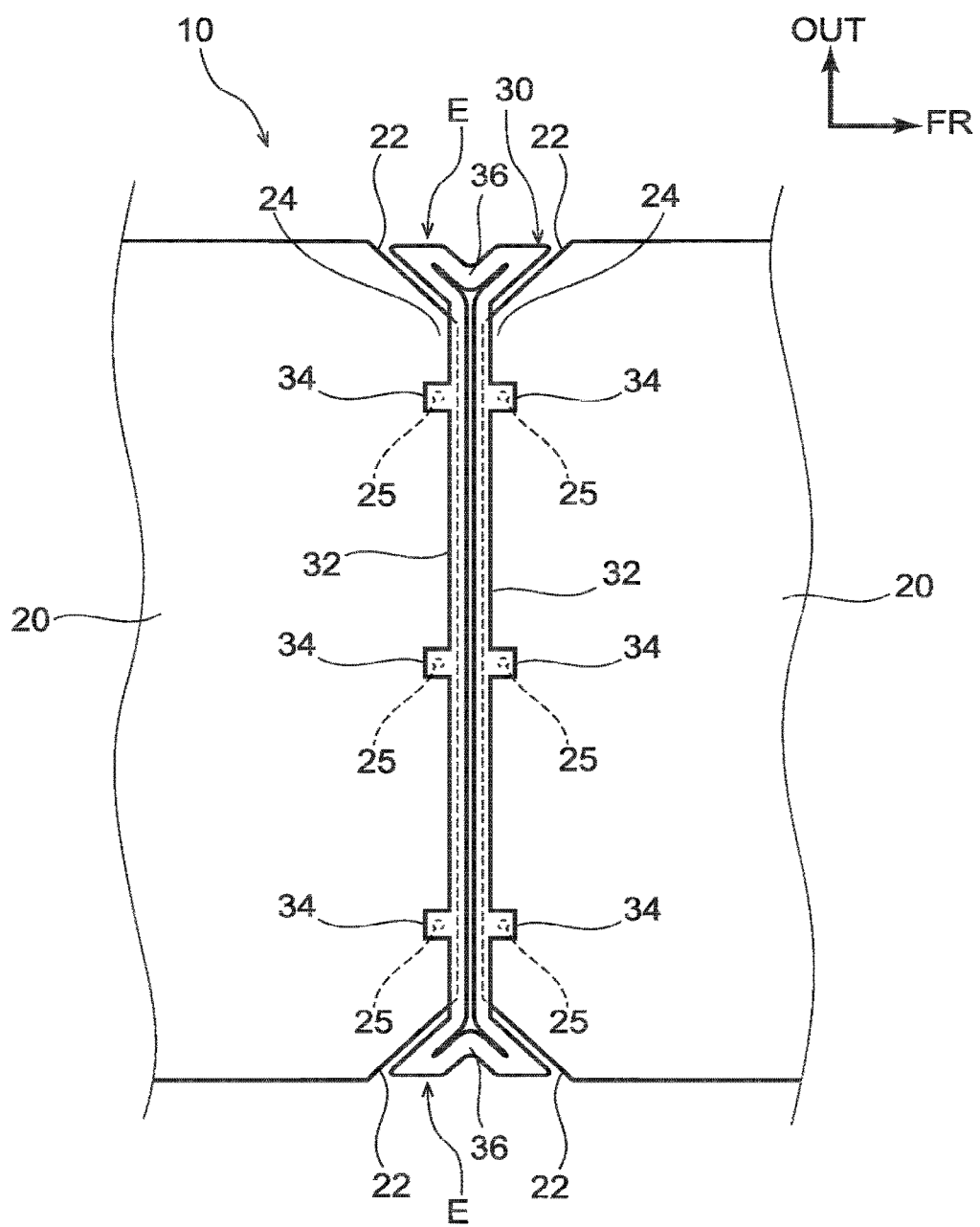
FIG. 3 is a partial enlarged bottom face view illustrating a solar battery module according to the first exemplary embodiment.

To explain in more detail, as illustrated in FIG. 2 and FIG. 3, plural (for example, three) electrodes 25 spaced at intervals along the vehicle width direction are provided at the back face side of each of the peripheral edge portions 24 that run along the vehicle width direction of each of the solar battery cells 20. The solar battery cells 20 are what are known as back-contact solar battery cells. Connections 34 of interconnectors 30, described below, are bonded to the electrodes 25 by, for example, soldering.

The interconnectors 30 include a front-rear pair of (two) connector bodies 32 and plural connections 34 (for example, three each). Each connector body 32 extends in the vehicle width direction running along the peripheral edge portions 24, and is respectively bonded to mutually opposing peripheral edge portions 24. Each connection 34 projects out in a rectangular shape from each of the connector bodies 32 toward the vehicle body front side or the vehicle body rear side and are bonded to the respective electrodes 25.

Moreover, the interconnectors 30 include a left-right pair of shock absorbers 36. The shock absorbers 36 are integrally and continuously provided at both extension direction (vehicle width direction) end portions of the front-rear pairs of connector bodies 32, and electrically connect the connector bodies 32 bonded to each of the peripheral edge portions 24. Namely, each of the interconnectors 30 is formed in a circuit shape in plan view by the front-rear pair of connector bodies 32 and the left-right pair of shock absorbers 36.

The shock absorbers 36 are disposed in regions E between respective corner portions 22 of the solar battery cells 20 that are adjacent to each other in the vehicle body front-rear direction, and are formed in a substantially looped triangular shape so as to fill in the diagonally cut away portion. Plural of the interconnectors 30 are provided, and, as illustrated in FIG. 1, electrodes 25 of plural solar battery cells 20 in a row along the vehicle body front-rear direction are electrically connected to one another.

Interconnectors 30 are bonded to the peripheral edge portions 24 that form vehicle body front side end portions of each of the solar battery cells 20 disposed at the frontmost portion of the two rows at the right side, and the connector bodies 32 at the vehicle body front side of these interconnectors 30 are electrically connected by a tab line 26. Similarly, interconnectors 30 are bonded to the peripheral edge portions 24 that form vehicle body front side end portions of each of the solar battery cells 20 disposed at the frontmost portion of the two rows at the left side, and the connector bodies 32 at the vehicle body front side of these interconnectors 30 are electrically connected by a tab line 26.

Moreover, interconnectors 30 are bonded to the peripheral edge portions 24 that form vehicle body rear side end portions of each of the solar battery cells 20 disposed at the rearmost portion of the two rows at the center side, and the connector bodies 32 at the vehicle body rear side of these interconnectors 30 are electrically connected by a tab line 26. Interconnectors 30 are also bonded to the peripheral edge portions 24 that form vehicle body rear side end portions of each of the solar battery cells 20 disposed at the rearmost portion of the row at the right side and the row at the left side, and the connector bodies 32 at the vehicle body rear side of these interconnectors 30 are electrically connected to respective tab lines 28.

Namely, one (for example, the right side) tab line 28A configures a "+ (positive)" electrode, and another (for example, the left side) tab line 28B configures a "− (negative)" electrode, and the solar battery cells 20 are connected in series by the interconnectors 30 and the tab lines 26 from the one tab line 28A to the other tab line 28B.

Electricity generated by the solar battery cells 20 is thereby obtained through the tab lines 28A, 28B. Note that the solar battery module 10 may be inverted in the vehicle body front-rear direction compared to the configurations shown in FIG. 1. Namely, the tab lines 28 side may be at the vehicle body front side.

Moreover, the plural solar battery cells 20 and the plural interconnectors 30 are sealed by a sealing layer 14, as illustrated in FIG. 4A. To the sealing layer 14, a back face layer 16 is adhered from the back face of the solar battery module 10, and a front face layer 18 is adhered from the front face of the solar battery module 10.

Examples of the material of the sealing layer 14 include thermoplastic resins and crosslinked resin, and examples thereof include ethylene-vinyl acetate (EVA) copolymer resins, polyvinyl butyral (PVB) resin, and silicone resin. Of these, EVA copolymer resins are particularly preferable.

The back face layer 16 is formed from a material having a greater linear expansion coefficient than the solar battery cells 20, and is, for example, formed from a metal material such as aluminum. In cases in which the back face layer 16 is formed from a metal material such as aluminum, the linear expansion coefficient of the front face layer 18 formed from a resin material described below is greater than that of the back face layer 16; however, expansion of the front face layer 18 is suppressed by the back face layer 16.

The front face layer 18 is a layer that protects the solar battery cells 20 and the interconnectors 30 from erosion by physical shock, rain, gas, and the like, and is formed from a resin material having optical transparency and a greater linear expansion coefficient than the solar battery cells 20. The resin material that forms the front face layer 18 is not particularly limited as long as it is able to transmit sunlight, and a conventionally known resin material may be employed.

Examples thereof include polycarbonate (PC) resins, polymethyl methacrylate (PMMA) resins, polyethylene (PE) resins, polypropylene (PP) resins, polystyrene (PS) resins, acrylonitrile-styrene copolymer (AS) resins, acrylonitrile-butadiene-styrene copolymer (ABS) resins, polyethylene terephthalate (PET) resins, polyethylene naphthalate (PEN) resins, polyvinyl chloride (PVC) resins, polyvinylidene chloride (PVDC) resins, and polyamide (PA) resins.

Of these, polycarbonate resins, and polymethyl methacrylate resins are preferable, and polycarbonate resins are particularly preferable. A front face layer 18 formed from polycarbonate resin or the like is well-suited as the front face layer 18 of an onboard solar battery module 10 mounted to a vehicle due to being lightweight.

As an example, the solar battery cells 20 and the interconnectors 30 each have a plate thickness of 0.2 mm. Moreover, as an example, the thickness of the sealing layer 14 is set to from 0.8 mm to 1.2 mm, the thickness of the back face layer 16 is set to from 1.0 mm to 1.2 mm, and the thickness of the front face layer 18 is set to 0.8 mm.

The back face layer 16 is not limited to being formed from a metal material such as aluminum, and, as illustrated in FIG. 4B, may be formed from the same resin material as the front face layer 18. Namely, the back face layer 16 and the front face layer 18 may be formed from the same resin material appropriately selected from the resin materials mentioned above, or the back face layer 16 and the front face layer 18 may be formed from different resin materials appropriately selected from the resin materials mentioned above.

In cases in which the back face layer 16 is formed from a resin material, as an example, the thickness of the back face layer 16 is set to from 1.0 mm to 2.0 mm, and the thickness of the front face layer 18 is set to from 2.0 mm to 3.0 mm. Moreover, the solar battery cells 20 and the interconnectors 30 each have a plate thickness of 0.2 mm, and the thickness of the sealing layer 14 is set to from 0.8 mm to 1.2 mm.

Next, explanation follows regarding operation of the solar battery module 10 according to the first exemplary embodiment configured as described above.

As described above, the solar battery cells 20 are adhered to the back face layer 16 and the front face layer 18 by the sealing layer 14. If a rapid temperature change is applied to the solar battery module 10, due to the difference between the linear expansion coefficients of the solar battery cells 20 and the back face layer 16, and between the linear expansion coefficients of the solar battery cells 20 and the front face layer 18, warping (expansion and contraction due to heat) arises in the solar battery module 10 in an in-plane direction, and a phenomenon occurs in which the warping is absorbed at spacings W between the mutually opposing peripheral edge portions 24 of the solar battery cells 20 (see FIG. 5).

Specifically, accompanying expansion or contraction of at least one out of the back face layer 16 or the front face layer 18, the solar battery cells 20 move, overall, in a diagonal direction with respect to the vehicle width direction and the vehicle body front-rear direction. More specifically, for example, with reference to the bottom left solar battery cell 20 illustrated in FIG. 5, the top left solar battery cell 20 illustrated in FIG. 5 moves in the vehicle width direction, the bottom right solar battery cell 20 illustrated in FIG. 5 moves in the vehicle body front-rear direction, and the top right solar battery cell 20 illustrated in FIG. 5 moves in a diagonal direction with respect to the vehicle width direction and the vehicle body front-rear direction.

This changes the spacings W between the mutually opposing peripheral edge portions 24 of the solar battery cells 20. Namely, if the solar battery module 10 expands, the spacings W between the mutually opposing peripheral edge portions 24 of the solar battery cells 20 widen (see FIG. 5), and if the solar battery module 10 contracts, the spacings W between the mutually opposing peripheral edge portions 24 of the solar battery cells 20 shrink (the solar battery cells 20 move in a direction opposite to the direction of the arrows illustrated in FIG. 5).

As described above, if the solar battery cells 20 move, overall, in a diagonal direction with respect to the vehicle width direction and the vehicle body front-rear direction, the connector bodies 32 of the interconnectors 30 also follow and move with the solar battery cells 20 since the connections 34 of the connector bodies 32 are connected to the electrodes 25. Accordingly, shock absorbers 36 that permit this movement are provided at the interconnectors 30 of the solar battery module 10 according to the present exemplary embodiment.

To explain in more detail, interconnectors lacking the shock absorbers 36 (omitted from illustration) are liable to break due to fatigue resulting from repeated movement of the solar battery cells 20 like that described above. Moreover, if the rigidity of the connector main bodies is increased in order to suppress breaks in the interconnectors, the connections move with the connector main bodies such that stress is placed on portions of the solar battery cells 20 provided with the electrodes 25, and connection breaks are liable to occur at locations where the solar battery cells 20 are provided with the electrodes 25.

Figure 5:
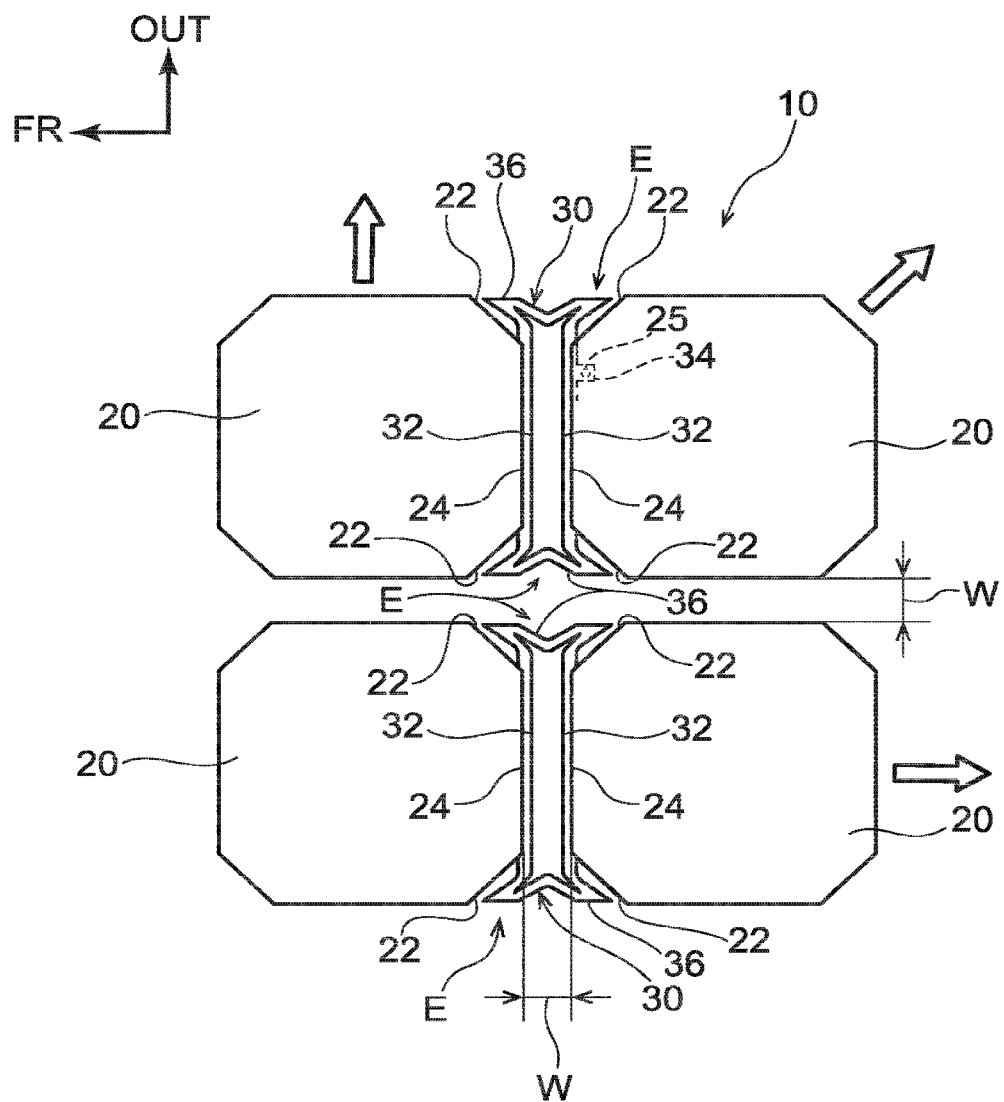
FIG. 5 is a partial enlarged plan view illustrating a state after a solar battery module according to the first exemplary embodiment has expanded.

However, since shock absorbers 36 are provided at the interconnectors 30 of the present exemplary embodiment, as, for example, illustrated in FIG. 5, even if the solar battery cells 20 move in directions so as to separate from each other due to thermal expansion of the solar battery module 10, the shock absorbers 36 permit (absorb) the following movement (displacement) of the connector bodies 32. Namely, even if stress is placed on the interconnectors 30 accompanying movement of the solar battery cells 20, deformation of the shock absorbers 36 enables the stress to be effectively absorbed.

Accordingly, even if a rapid temperature change is applied to the solar battery module 10, it is possible to suppress or prevent breaks in the interconnectors 30 that electrically connect the solar battery cells 20 together. It is also possible to suppress or prevent connection breaks at locations where the solar battery cells are connected to the connections 34 of the interconnectors 30 of the solar battery cells 20.

Moreover, the shock absorbers 36 are disposed in the regions E between the mutually opposing corner portions 22 of the solar battery cells 20, effectively utilizing dead space of the solar battery module 10. Namely, space for disposing the shock absorbers 36 can be efficiently secured even in configurations in which the shock absorbers 36 are formed at the interconnectors 30.

Accordingly, spacings W between the mutually opposing peripheral edge portions 24 of the solar battery cells 20 can be made as narrow as possible, and a decrease in the cell-to-total-surface-area ratio of the solar battery cells 20 in the solar battery module 10 can be suppressed. This is particularly effective in cases in which the space for mounting the solar battery module 10 is limited, such as on the roof 12 of a vehicle.

Figure 6A:
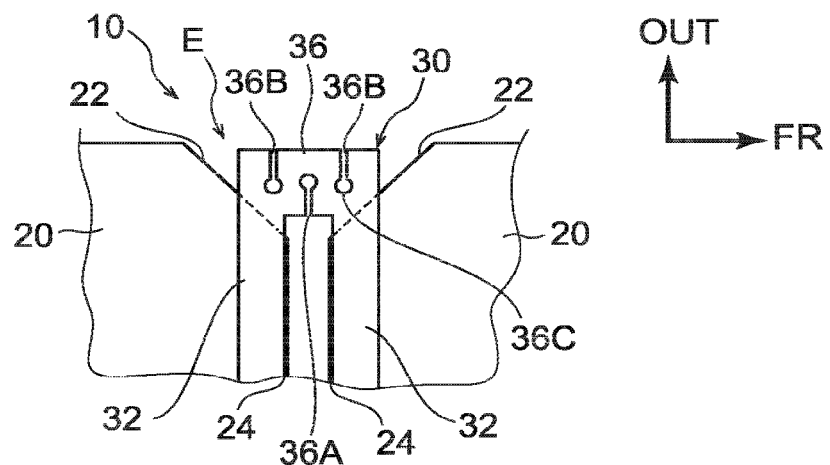
FIG. 6A is a partial enlarged bottom face view illustrating a first modified example of an interconnector of a solar battery module according to the first exemplary embodiment.

The shape of the shock absorbers 36 is not limited to that illustrated in FIG. 2 and FIG. 3, and may, for example, be one of those illustrated in FIG. 6A. The shock absorbers 36 according to the first modified example illustrated in FIG. 6A are formed substantially flat rectangular plate shaped, and are each configured by forming one slit 36A at the inner side along the extension direction of the connector body 32, and forming two slits 36B at the outer side along the extension direction of the connector body 32.

Namely, the slit 36A is formed at a central portion at the inside of each of the shock absorbers 36, and the slits 36B are respectively formed on both sides of the slit 36A at the outer sides of each of the shock absorbers 36. At the leading end of the respective slits 36A, 36B, circular shaped holes 36C having diameters greater than the widths of the respective slits 36A, 36B are formed continuously with the respective slits 36A, 36B in order to prevent the shock absorber 36 from cracking from the respective slits 36A, 36B.

Figure 6B:
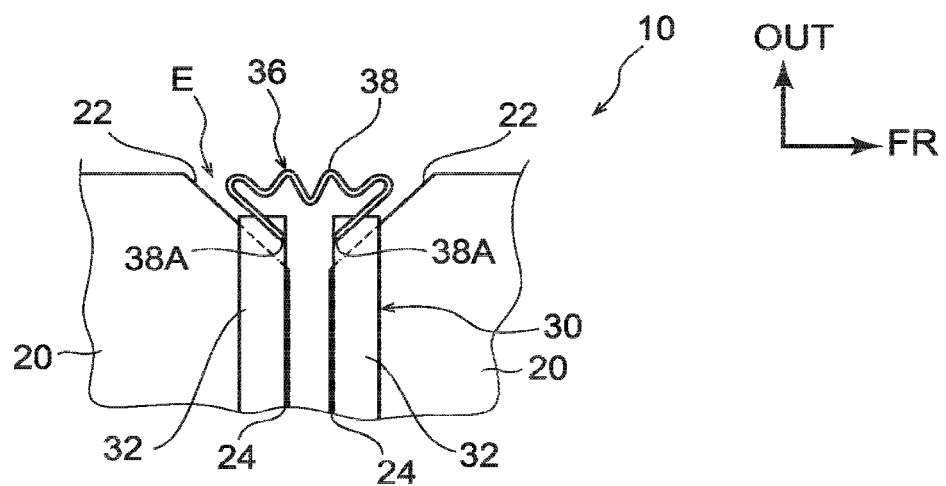
FIG. 6B is a partial enlarged bottom face view illustrating a second modified example of an interconnector of a solar battery module according to the first exemplary embodiment.

Alternatively, the shock absorbers 36 may be as illustrated in FIG. 6B. The shock absorbers 36 according to the second modified example illustrated in FIG. 6B are configured by respectively bonding both end portions 38A of wire shaped steel having spring characteristics (referred to as a "spring portion" hereafter) to both extension direction end portions of the front-rear pair of connector bodies 32 by soldering. The shape of the spring portion 38 is not limited to the substantially waveform shape (meandering shape), in plan view, of the drawings.

Figure 6C:
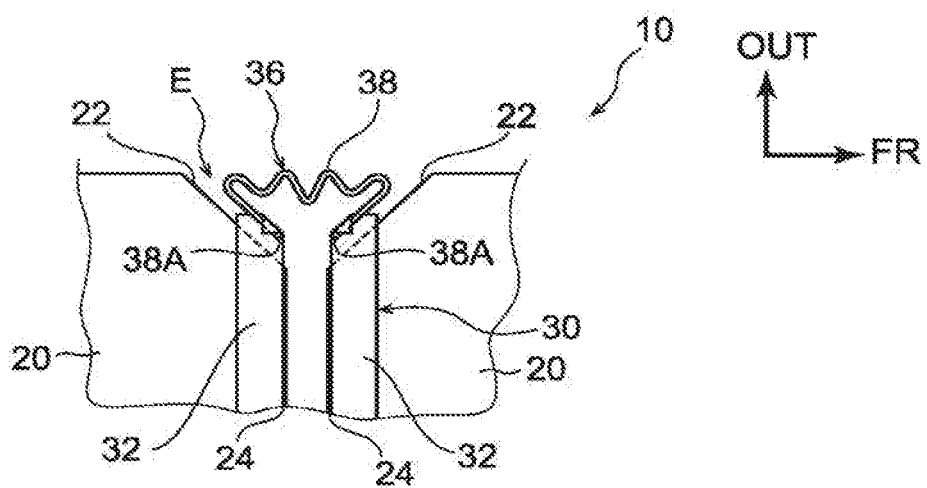
FIG. 6C is a partial enlarged bottom face view illustrating a third modified example of an interconnector of a solar battery module according to the first exemplary embodiment.
Figure 6D:
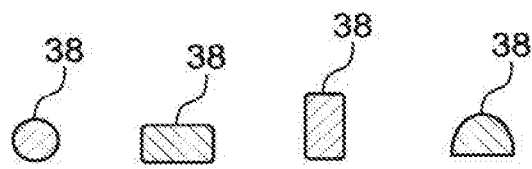
FIG. 6D is a diagram illustrating a cross-section profile of a shock absorber of an interconnector in the second modified example and the third modified example.

Alternatively, as in the third modified example illustrated in FIG. 6C, both end portions 38A of the spring portion 38 can be bonded to both extension direction end portions of the connector bodies 32 by soldering, after bending both extension direction end portions of the connector bodies 32 so as to respectively wrap around both end portions 38A. The cross-section profile of the spring portion 38 may be circular shaped, or may be rectangular shaped or semicircular shaped, as illustrated in FIG. 6D.

Second Exemplary Embodiment

Next, explanation follows regarding a solar battery module 10 according to a second exemplary embodiment. Note that locations similar to those of the first exemplary embodiment described above are allocated the same reference numerals and detailed explanation thereof (including common operation) is omitted as appropriate. Moreover, shock absorbers 46, described below, are omitted from FIG. 7 and FIG. 12.

Figure 7:
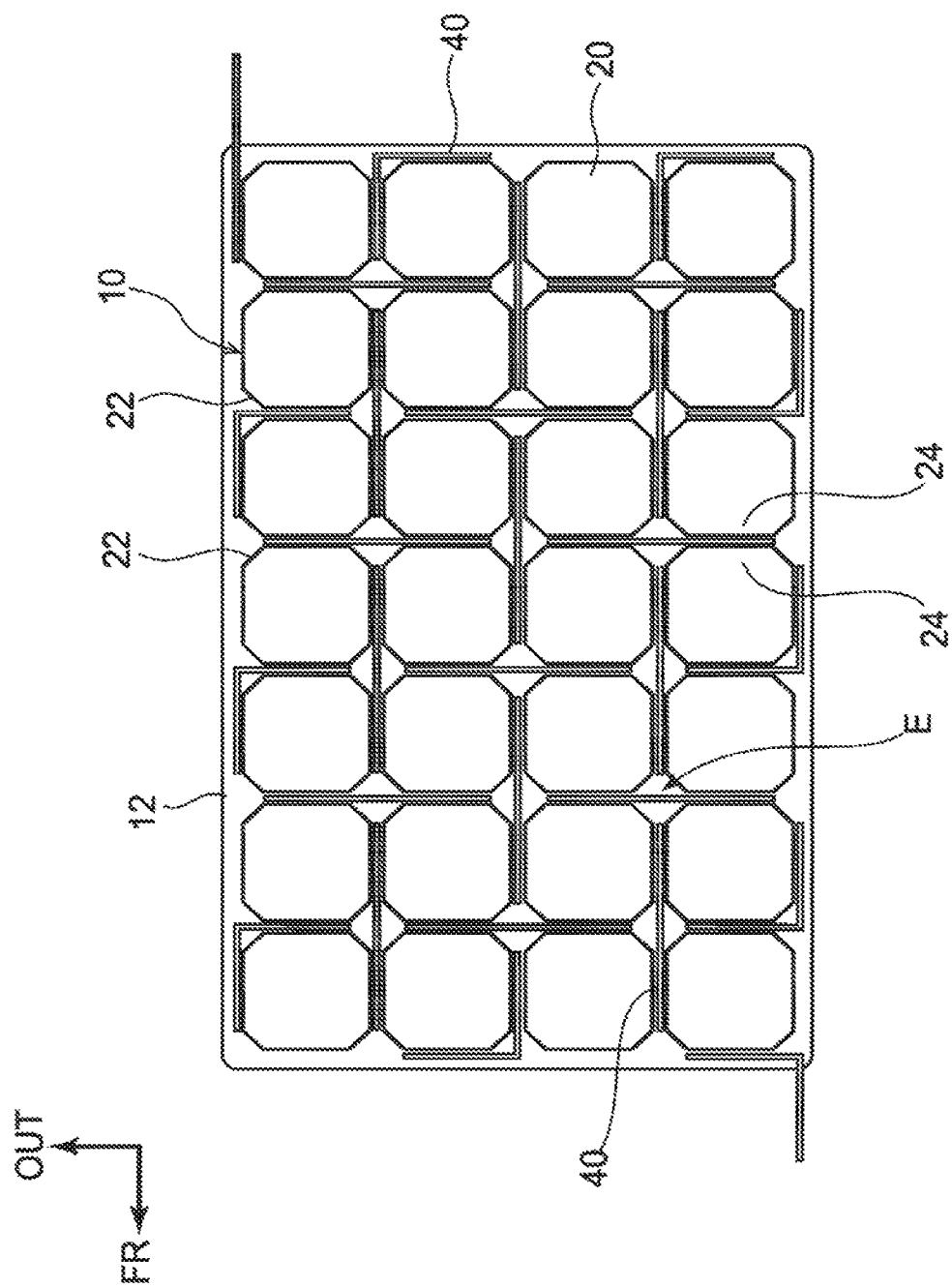
FIG. 7 is a plan view illustrating a solar battery module according to a second exemplary embodiment.

As illustrated in FIG. 7, the solar battery module 10 according to the second exemplary embodiment also includes plural solar battery cells 20 two-dimensionally arrayed in plan view (for example, arrayed with four rows in the vehicle width direction and seven rows in the vehicle body front-rear direction). Plural interconnectors 40 either connect respective electrodes 25 of the plural solar battery cells 20 that are adjacent to each other in the vehicle width direction or the vehicle body front-rear direction, or connect respective electrodes 25 of the plural solar battery cells 20 that are disposed diagonally to each other across regions E.

Figure 8:
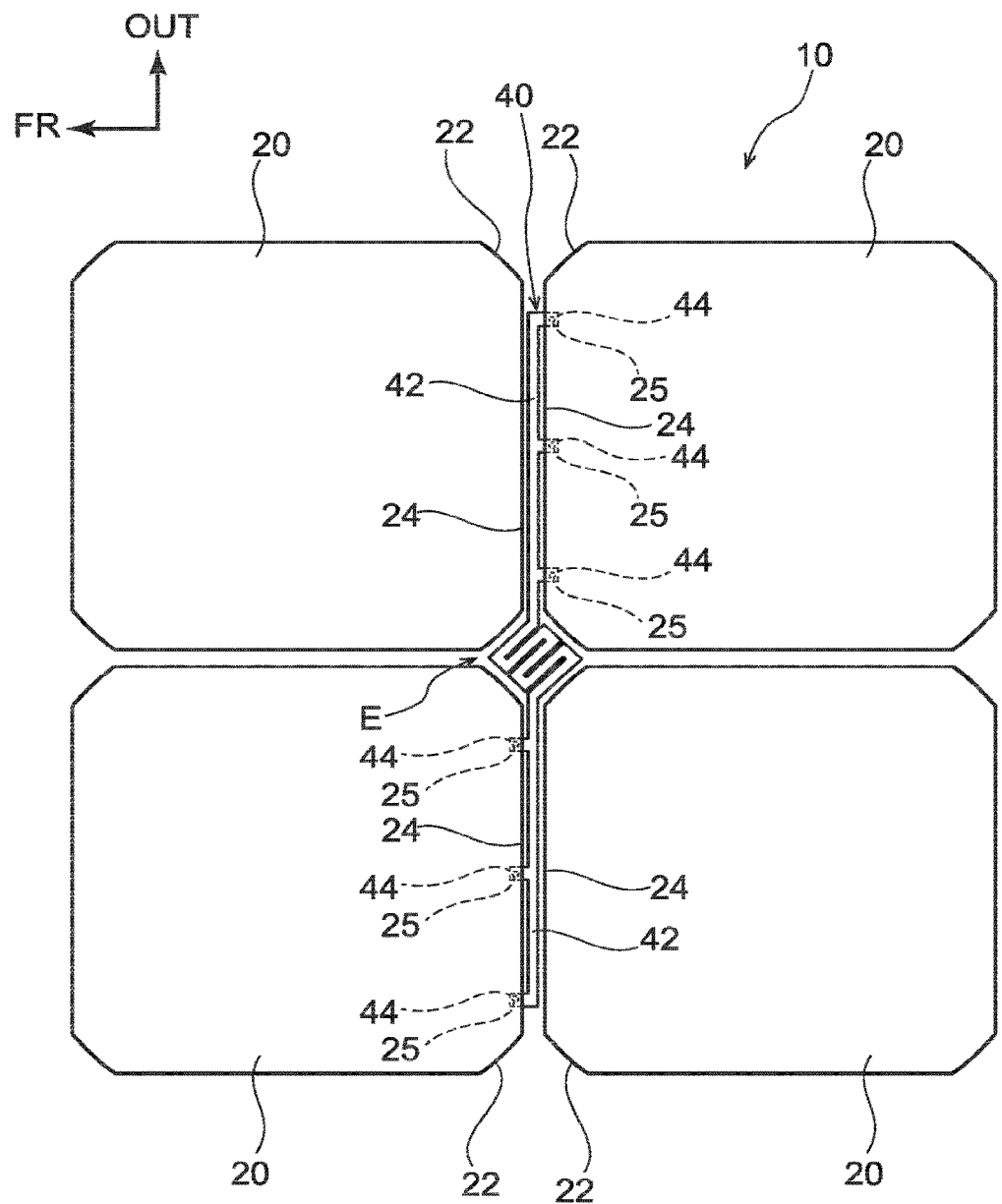
FIG. 8 is a partial enlarged plan view illustrating a solar battery module according to the second exemplary embodiment.

To explain in more detail, as, for example, illustrated in FIG. 8, in four solar battery cells 20 disposed opposing each other in the vehicle body front-rear direction and the vehicle width direction, the interconnector 40 includes a pair of connector bodies 42 respectively disposed between mutually opposing peripheral edge portions 24 of two pairs of vehicle body front-rear direction adjacent solar battery cells 20. Namely, the connector bodies 42 extend in the vehicle width direction along the peripheral edge portions 24, and the interconnector 40 is formed in straight line shape in plan view.

Plural (for example, three) connections 44 projecting out from the connector body 42 that is disposed at the vehicle width direction outside toward the vehicle body rear side are bonded to the electrodes 25 of the solar battery cell 20 at the vehicle width direction outside rear by soldering. Similarly, plural (for example, three) connections 44 projecting out from the connector body 42 that is disposed at the vehicle width direction inside toward the vehicle body front side are bonded to the electrodes 25 of the solar battery cell 20 at the vehicle width direction inside front by soldering.

Namely, the interconnectors 40 connect respective electrodes 25 of the solar battery cells 20 that are disposed diagonally to each other across the regions E. Moreover, the interconnectors 40 include shock absorbers 46 that integrally couple together connector bodies 42 extending in the vehicle width direction. The shock absorbers 46 are formed in a meandering shape that does not form a loop in plan view, and are formed substantially rectangular shaped at approximately the same size as the regions E so as to fill the regions E.

Figure 9:
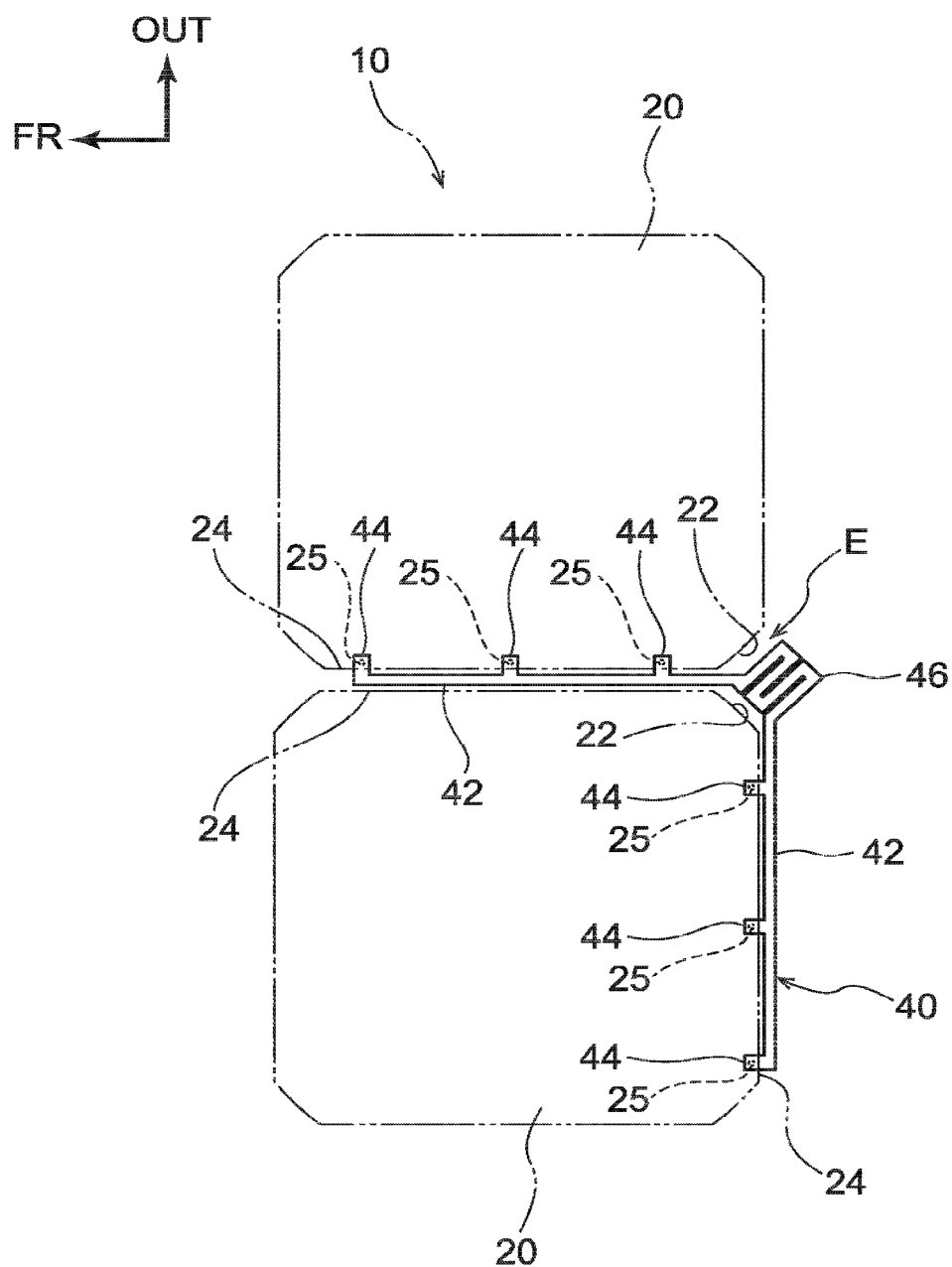
FIG. 9 is a partial enlarged plan view illustrating a solar battery module according to the second exemplary embodiment.

In some cases, the interconnectors 40 also connect together electrodes 25 of plural solar battery cells 20 that are adjacent to each other in the vehicle width direction (or the vehicle body front-rear direction), for example, as illustrated in FIG. 9. In such cases, one of the connector bodies 42 of the interconnector 40 is disposed between mutually opposing peripheral edge portions 24 of solar battery cells 20 that are adjacent to each other in the vehicle width direction, and plural (for example, three) connections 44 that project out from that connector body 42 toward the vehicle width direction outside are bonded to the electrodes 25 of the solar battery cell 20 at the vehicle width direction outside by soldering.

Similarly, the other connector body 42 of the interconnector 40 is disposed at the vehicle body rear side of the solar battery cell 20 at the vehicle width direction inside, and plural (for example, three) connections 44 projecting out from that connector body 42 toward the vehicle body front side are bonded to the electrodes 25 of the solar battery cell 20 at the vehicle width direction inside by soldering. Namely, the interconnector 40 is formed substantially L shaped in plan view.

This interconnector 40 also includes the shock absorber 46 that integrally couples the one connector body 42 to the other connector body 42. This shock absorber 46 is also formed in a meandering shape that does not form a loop in plan view, and is formed substantially rectangular shaped at approximately the same size as the regions E so as to fill the regions E between the mutually opposing corner portions 22 of the solar battery cells 20 that are adjacent to each other in the vehicle width direction.

Moreover, as illustrated in FIG. 7, the tab lines 26, 28 are unnecessary in the solar battery module 10 according to the second exemplary embodiment. Namely, a connector body 42 at the vehicle body front side of a straight line shaped interconnector 40 is bonded to the peripheral edge portion 24 that forms the vehicle width direction outside end portion of the solar battery cell 20 disposed at the rightmost rear portion, and the connector body 42 projecting out toward the vehicle body rear side of this interconnector 40 forms, for example, a "+ (positive)" electrode.

A connector body 42 extending in the vehicle width direction of an interconnector 40 in a substantial L shape is bonded to the peripheral edge portion 24 that forms the vehicle body front side end portion of the solar battery cell 20 disposed at the leftmost front portion, and the connector body 42 projecting out toward the vehicle body front side of this interconnector 40 forms, for example, a "− (negative)" electrode. The solar battery cells 20 are thereby connected in series by the interconnectors 40 from the interconnector 40 at the rightmost rear portion to the interconnector 40 at the leftmost front portion.

The solar battery module 10 according to the second exemplary embodiment configured as described above also obtains similar advantageous operational effects to the first exemplary embodiment described above.

Namely, since shock absorbers 46 are provided at the interconnectors 40 that electrically connect the solar battery cells 20, following movement (displacement) of the connector bodies 42 accompanying movement of the solar battery cells 20 due to rapid temperature changes are permitted (absorbed) by the shock absorbers 46. Namely, even when stress is placed on the interconnectors 40 accompanying movement of the solar battery cells 20, deformation of the shock absorbers 46 enables the stress to be effectively absorbed, for example, as illustrated in FIG. 10.

Accordingly, even if a rapid temperature change is applied to the solar battery module 10, it is possible to suppress or prevent breaks in the interconnectors 40 that electrically connect the solar battery cells 20 together. It is also possible to suppress or prevent connection breaks at locations where the solar battery cells 20 are connected to the connections 44 of the interconnectors 40.

Since the shock absorbers 46 are formed in meandering shapes that do not form a loop in plan view, even in cases in which there is a large change in the spacings W (see FIG. 10) between the mutually opposing peripheral edge portions 24 of the solar battery cells 20 (for example, in cases in which the back face layer 16 is a resin layer (see FIG. 4B)), such large changes can also be accommodated.

Moreover, dead space of the solar battery module 10 can be effectively utilized (space for disposing the shock absorbers 46 can be efficiently secured) since the shock absorbers 46 are disposed in the regions E between mutually opposing corner portions 22 of the solar battery cells 20.

Accordingly, even in configurations in which the shock absorbers 46 are formed at the interconnectors 40, the spacings W between the mutually opposing peripheral edge portions 24 of the solar battery cells 20 can be made as narrow as possible, and a decrease in the cell-to-total-surface-area ratio of the solar battery cells 20 in the solar battery module 10 can be suppressed.

Note that the shock absorber 46 can have larger dimensions in a case in which the interconnector is configured as the straight line shaped interconnector 40 illustrated in FIG. 8, at which the shock absorbers 46 of the interconnectors 40 connect respective electrodes 25 of the solar battery cells 20 that are disposed diagonally to each other across the regions E, than in a case in which the interconnector is configured as the substantially L shaped interconnector 40 illustrated in FIG. 9.

Figure 11A:
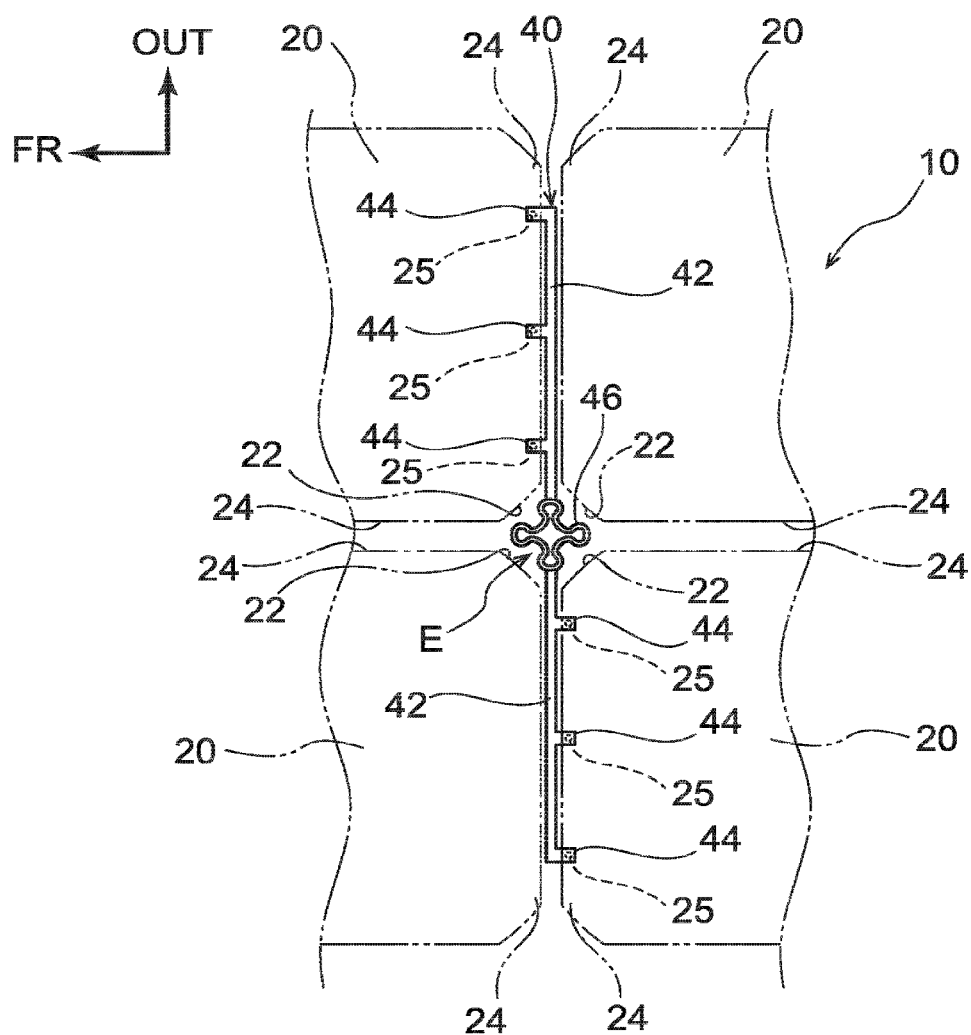
FIG. 11A is a partial enlarged plan view illustrating a modified example of an interconnector corresponding to FIG. 8 of a solar battery module according to the second exemplary embodiment.
Figure 11B:
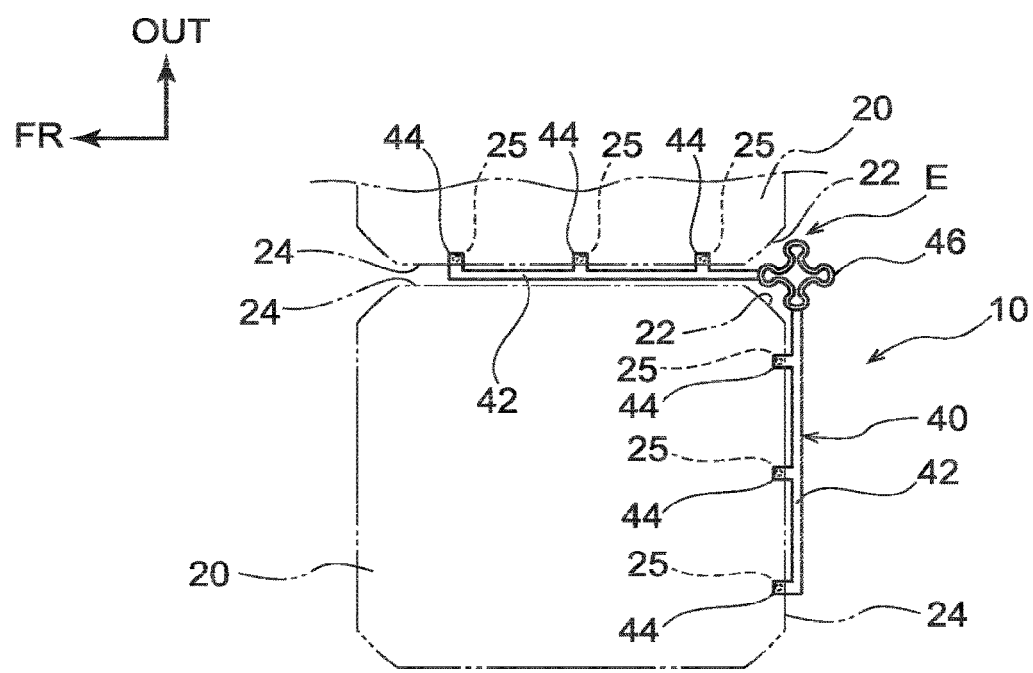
FIG. 11B is a partial enlarged plan view illustrating a modified example of an interconnector corresponding to FIG. 9 of a solar battery module according to the second exemplary embodiment.

The shape of the shock absorbers 46 of the interconnectors 40 is not limited to the non-looping meandering shape illustrated in FIG. 8 and FIG. 9, and, for example, may be a meandering shape that loops in plan view as illustrated in FIG. 11A and FIG. 11B (a shape like a four leafed clover). Moreover, in the solar battery module 10 according to the second exemplary embodiment, the solar battery cells 20 may be disposed in a diagonal lattice pattern as, for example, illustrated in FIG. 12.

Although explanation has been given above regarding the solar battery module 10 according to the present exemplary embodiments with reference to the drawings, the solar battery module 10 according to the present exemplary embodiments is not limited to that illustrated, and various design modifications may be applied as appropriate within a range not departing from the spirit of the present disclosure. For example, the solar battery cell 20 is not limited to two dimensionally arrayed configurations, and may be configured by a three dimensional array. Moreover, the shape of the shock absorbers 36, 46 is not limited to the meandering shapes of the drawings.

Moreover, the thicknesses of the back face layer 16 and the front face layer 18 are not limited to the dimensions described above. For example, as illustrated in FIG. 4B, in cases in which the back face layer 16 is formed from a resin material, the thickness of the back face layer 16 may be the same as the thickness of the front face layer 18. Moreover, the interconnectors 30, 40 are not limited to configurations being bonded to the electrodes 25 of the solar battery cells 20 by soldering. Moreover, the solar battery module 10 according to the present exemplary embodiments is not limited to configurations provided at the roof 12 of a vehicle.

What is claimed is:

1. A solar battery module comprising:
    a plurality of solar battery cells that are each formed substantially rectangular-shaped, and that each include a plurality of electrodes on a peripheral edge portion at a back face, the peripheral edge portion extending between corner portions of the solar battery cells;
    a plurality of interconnectors, each of the interconnectors including (i) a first connector body that extends along an entirety of a peripheral edge portion of a solar battery cell and electrically connects electrodes disposed at the peripheral edge portion, the first connector body being electrically conductive, (ii) a second connector body that is spaced apart from the first connector body at portions except end portions along a length direction, extends along an entirety of a peripheral edge portion of an other solar battery cell, and electrically connects electrodes disposed at the peripheral edge portion of the other solar battery cell, the second connector body being electrically conductive, and (iii) a shock absorber that connects respective end portions along the length direction of the first connector body and the end portions along the length direction of the second connector body, the shock absorber being electrically conductive and including a first shock absorber connected at a first end of the first connector body and a first end of the second connector body and a second shock absorber connected at a second end of the first connector body and a second end of the second connector body;
    a sealing layer that seals the plurality of solar battery cells and the plurality of interconnectors;
    a back face layer that is formed from a metal material or a resin material having a greater linear expansion coefficient than the linear expansion coefficient of the solar battery cells, and that is adhered to a back face of the sealing layer which does not receive sunlight; and
    a front face layer that is formed from a resin material having optical transparency and a greater linear expansion coefficient than the linear expansion coefficient of the solar battery cells, and that is adhered to a front face of the sealing layer on the opposite side to the back face of the sealing layer;
    wherein each shock absorber is disposed in a region between the corner portions of solar battery cells that are adjacent or diagonally opposed to each other among the plurality of solar battery cells, and each shock absorber permits movement of the solar battery cells accompanying expansion or contraction of at least one out of the back face layer or the front face layer.

2. The solar battery module of claim 1, wherein each shock absorber is formed in a waveform shape in plan view.

3. The solar battery module of claim 1, wherein the interconnectors are formed in a circuit shape in plan view, with each shock absorber disposed in a region, among a plurality of the regions, at each extension direction end of the interconnectors.

4. The solar battery module of claim 1, wherein the shock absorber elongates based on relative displacement between the solar battery cell and the other solar battery cell.

5. The solar battery module of claim 1,
    wherein the corner portions are chamfered edges extending between an end of a first peripheral edge portion of the solar battery cell and an end of a second peripheral edge portion of the solar battery cell,
    wherein the shock absorber is disposed in a region defined by the chamfered edges outside in an extension direction of the respective peripheral edge portions of the solar battery cell and the other solar battery cell.

* * * * *